United States Patent [19]
Ueda

[11] Patent Number: 5,638,292
[45] Date of Patent: Jun. 10, 1997

[54] METHOD FOR AUTOMATICALLY OPTIMIZING CELL PLACEMENT

[75] Inventor: Toshiaki Ueda, Kanagawa-ken, Japan

[73] Assignee: Kabushiki Kaisha Toshiba, Kawasaki, Japan

[21] Appl. No.: 130

[22] Filed: Jan. 4, 1993

[30] Foreign Application Priority Data

Jan. 9, 1992 [JP] Japan ................................. 4-002100
Sep. 3, 1992 [JP] Japan ................................. 4-235996

[51] Int. Cl.$^6$ ................................................. G06F 15/00
[52] U.S. Cl. .......................... 364/491; 395/800; 364/490; 364/148
[58] Field of Search .................................. 395/800, 500, 395/919, 920, 921, 922, 923; 364/148, 488, 489, 490, 491

[56] References Cited

U.S. PATENT DOCUMENTS

| | | | |
|---|---|---|---|
| 4,593,363 | 6/1986 | Burstein et al. | 364/491 |
| 4,754,408 | 6/1988 | Carpenter et al. | 364/491 |
| 4,964,057 | 10/1990 | Yabe | 364/491 |
| 4,969,116 | 11/1990 | Wada et al. | 364/578 |
| 5,144,563 | 9/1992 | Date et al. | 364/491 |
| 5,159,682 | 10/1992 | Toyonaga et al. | 395/500 |
| 5,164,907 | 11/1992 | Yabe | 364/491 |
| 5,191,542 | 3/1993 | Murofushi | 364/491 |
| 5,200,908 | 4/1993 | Date et al. | 364/491 |
| 5,208,759 | 5/1993 | Wong | 364/468 |
| 5,224,057 | 6/1993 | Igarashi et al. | 364/490 |
| 5,267,176 | 11/1993 | Antreich et al. | 364/491 |
| 5,416,720 | 5/1995 | Fukui | 364/489 |
| 5,485,396 | 1/1996 | Brasen et al. | 364/491 |

OTHER PUBLICATIONS

IEEE Design & Test of Computers, Oct. 1987, F. Darema, et al., pp. 19–27, "Multipurpose Parallelism for VLSI CAD on the RP3".
IEEE Transactions on Computer–Aided Design, vol. CAD-2, No. 1, Jan. 1983, K. Ueda, et al., pp. 39–47, "A Parallel Processing Approach for Logic Module Placement".
Kumar et al, "Parallel Placement on Reduced Array Architecture," IEEE, pp. 121–127.
Upton et al, "Integrated Placement for Mixed Macro Cell and Standard Cell Designs," IEEE, 1990, pp. 32–35.

*Primary Examiner*—Alyssa H. Bowler
*Assistant Examiner*—Walter D. Davis
*Attorney, Agent, or Firm*—Oblon, Spivak, McClelland, Maier & Neustadt, P.C.

[57] ABSTRACT

A method for automatically optimizing cell placement on a chip using many processors. In the method, the chip is divided into first regions along a first direction. In each first region, a cell is moved in only one direction, which is perpendicular to the first direction. This operation for each first region is executed at the same time by each processor. After an evaluation function is calculated for each first region, the optimized evaluated value for each first region is stored in a memory in each processor. Next, the chip is divided into second regions along a second direction which is vertical to the first direction. The second regions are moved in only one direction which is perpendicular to the second direction. In the same manner that the first regions are processed, the second regions are similarly processed. Thus, an optimizing cell placement can be obtained.

5 Claims, 5 Drawing Sheets

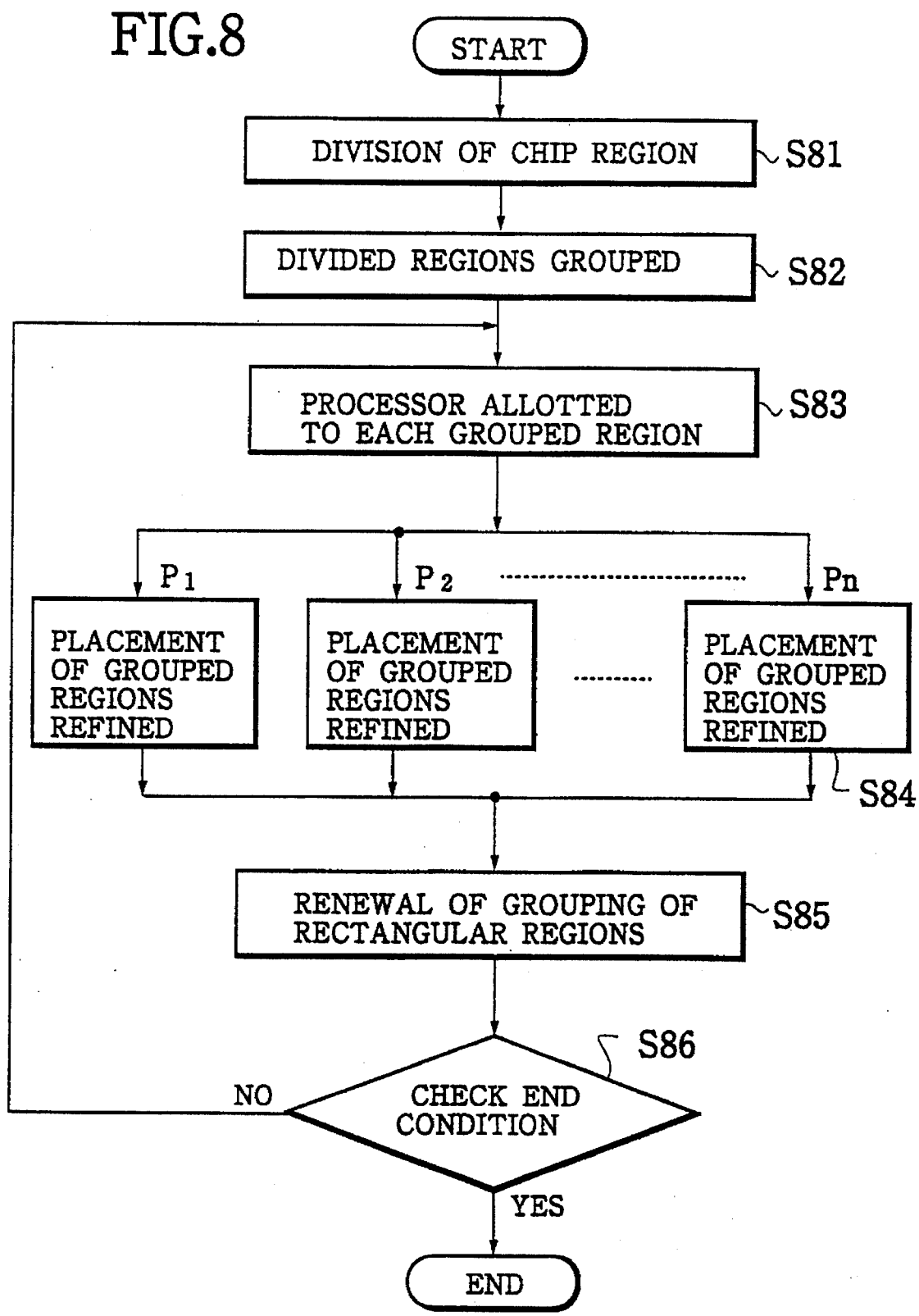

METHOD FOR AUTOMATICALLY OPTIMIZING CELL PLACEMENT

BACKGROUND OF THE INVENTION

1. Field of the Invention

The present invention relates to a method for automatic placement of a cell or a block in the layout of an integrated circuit by a gate array method or by a standard cell method, using a computer.

2. Description of the Prior Art

A semiconductor integrated circuit device has a configuration wherein cells or blocks with logic or memory functions are combined and arranged on a chip, and wiring is run among the respective I/O terminals of these cells and blocks so that a desired circuit operation is obtained.

FIG. 1 is a view showing a schematic configuration of a semiconductor integrated circuit chip which was designed using a conventional gate array method.

The chip comprises a region 51 wherein the cells are arranged, a region 52 wherein wiring is provided between the cells, and a region 53 wherein I/O circuits are provided on the periphery. The wiring region 52 is made up of a plurality of wiring layers. For example, the wiring in the horizontal and the vertical directions is conventionally distributed in different layers.

In this type of semiconductor integrated circuit device, when the layout of the cells and the like is determined by means of an automatic placement process using a computer the degree of complexity of the wiring must be made uniform, for example, the virtual wiring length must be minimized to simplify a subsequent wiring operation.

In the automatic placement process, normally, after the implementation of an initial placement phase in which the initial state of the placement is determined, the final placement is set by implementing a progressive placement refinement phase.

There are various procedures by which this progressive placement refinement phase can be implemented. Among them, the most simple method is a method of refining the placement which involves exchanging the position of a certain cell with that of another cell to create a new placement state. If this state is better than the original placement state, for example, if the virtual wiring length is shortened, the new placement state is adopted, if worse, a return is made to the original placement state, and these actions are repeated until an overall improvement is obtained. (M. Hanan, P. K. Wolff Sr., and B. J. Agule, "Some experimental results on placement techniques", Proceedings of the 13th Design Automation Conference, 1976, pp. 214 to 224).

This method leads to a drastic increase in the processing time required to improve the placement to satisfactorily meet the placement conditions as the result an increase in the number of cells. For this reason, if the number of cells is increased, the processing time is also increased, so there is the problem that implementation cannot be carried out.

Accordingly, it is necessary to achieve an increase in the processing speed to providing effective optimization within a finite processing time.

The following two methods are known as methods of solving the above-mentioned problems by refining the cell placement in parallel. Specifically, a method whereby the placement of like cells which are not directly connected is refined in parallel (first conventional method), and a method whereby placement is refined in parallel without this type of limitation—(second conventional method) have already been proposed ("A Parallel Processing Approach for Logic Module Placement", Kazuhiro UEDA, et al., IEEE Transactions on Computer-Aided Design, Vol. CAD-2, No.1, January 1983, pp.29–47).

However, with the former (first conventional method), in the case where cell exchange operations are implemented in parallel simultaneously, a means of selecting a pair of independent exchange cells which are not directly connected is introduced to eliminate refinement errors. For this reason, extra time is required with this method only for the time required for the computer to judge and qualify whether or not a pair of cells to be exchanged are mutually independent. Excessive processing time is necessary.

In addition, with this method a large number of repetitive operations are required until the refinement is completed, and it is difficult to proceed with an overall high-speed optimization because normally an extremely large number of pairs of exchange cells is present.

In addition, in the latter method (second conventional method), oscillation occurs when connected pairs of cells are exchanged because an operation to limit the number of pairs of independent exchange cells is not carried out.

For example, when placement of the cell shown as a circle in the upper right of FIG. 2A, and of the cell shown as a circle in the lower left of FIG. 2A, which is connected to this cell, is refined by different processors in parallel, the placement of this pair of cells is refined as shown in FIG. 2B because each processor tends to shorten the number of nets.

However, because each processor tends to further shorten the numbers of nets, the placement of this pair of cells is once again refined as in FIG. 2A. Because this type of refinement is repeated, oscillation (cells being alternately switched between two positions) occurs in the cell exchange. As a result, errors are produced in the respective refinement decisions and in the refinement decisions for the total chip.

There is also a method which differs from the above-described two placement refinement methods in parallel, whereby a region is simply divided to execute parallel operation. Because optimization occurs only within the divided region with this method, cell exchange between divided regions is not adequately provided.

The results of placement largely remain in the initial division, and it is difficult to optimize placement over the entire surface of the chip.

As outlined above, with the conventional cell placement refinement methods for automatic placement, there are the problems that the processing time required to improve the placement to satisfactorily meet the placement conditions drastically increases as the result an increase in the number of cells, refinement errors are produced, and it is difficult to finalize the process.

In particular, in the method whereby the chip region is simply divided to execute parallel operations, there are the problems that the number of divisions is limited by the number of processors which can utilized, cell exchange is not adequately provided between divided regions, the results of placement largely remain in the initial division, and it is difficult to optimize the placement over the entire surface of the chip.

SUMMARY OF THE INVENTION

Accordingly, an object of the present invention is to provide, with due consideration to the drawbacks of such conventional devices, a high speed method for automatic placement of cells whereby evaluation errors over an entire chip, produced when evaluating excess time and the degree of refinement in parallel, are eliminated in an operation to reduce cells by judging whether or not like cells moving simultaneously are connected, using placement refinement techniques performed in parallel.

According to one aspect of the present invention, there is provided an automatic cell placement method for placement of a plurality of logic blocks (or cells) on a semiconductor chip using a plurality of processors, comprising:

a step for dividing the chip into a plurality of rectangular regions in a first direction;

a step for initially positioning a plurality of logic blocks on the chip;

a step for running a predetermined number of cut-lines in each of the rectangular regions, parallel to the first direction;

a step for moving the logic blocks into the vertical direction of the cut-lines to form a new placement pattern;

a step for calculating an evaluation function relating to the placement of the logic block in each rectangular region using a first processor; for moving the logic block into the vertical direction of the first direction until the final conditions for an assessed value for the logic block within the rectangular region are satisfied when the assessed value within the rectangular region is below the previous assessed value to draw up a new placement pattern; and storing the placement pattern and the assessed value in a first memory means when the assessed value is greater than the previous assessed value;

a step for dividing the chip into a plurality of rectangular regions in a second direction;

a step for running a specified number of cut-lines which are set parallel to a second direction within the rectangular regions related to the logic block and for moving the logic blocks into the vertical direction of the second direction to form a new placement pattern;

a step for calculating an evaluation function relating to the placement of the logic block in each rectangular region, using the first processor; for moving the logic block into the vertical direction of the second direction until the final conditions for an assessed value for the logic block within the rectangular region are satisfied when the assessed value within the rectangular region is below the previous assessed value to draw up a new placement pattern; and for storing the placement pattern and the assessed value in the first memory means when the assessed value is greater than the previous assessed value;

a step for storing the placement pattern, which had been stored in the first memory means, in a second memory means using a second processor, when the final conditions for the assessed values for each logic block within the rectangular region are satisfied.

According to still another aspect of the present invention, there is provided an automatic cell placement method for placement of a plurality of logic blocks (or cells) on a semiconductor chip, using a plurality of processors comprising:

a step for dividing the chip into a plurality of rectangular regions in a first direction;

a step for initially positioning a plurality of logic blocks on the chip;

a step for moving the logic blocks parallel to the first direction and parallel to the second direction within the rectangular region to draw up a new placement pattern;

a step for calculating an evaluation function relating to the placement of the logic block in each rectangular region, using a first processor; for moving the logic block parallel to the first direction and the second direction until the final conditions for an assessed value for the logic block within the rectangular region are satisfied when the assessed value within the rectangular region is below the previous assessed value to draw up a new placement pattern; and for storing the placement pattern and the assessed value in a first memory means when the assessed value is greater than the previous assessed value;

a step for storing the placement pattern, which had been stored in the first memory means, in a second memory means using a second processor when the final conditions for the assessed values for each logic block within the rectangular region are satisfied, wherein the rectangular region is shifted with a predetermined distance on the chip and each of the foregoing steps is repeatedly implemented for the newly-obtained rectangular region to obtain the placement pattern for the logic block.

BRIEF DESCRIPTION OF THE DRAWINGS

These and other objects, features, and advantages of the present invention will become more apparent from the following description of the preferred embodiments taken in conjunction with the accompanying drawings, in which:

FIG. 8 is a flow chart showing the processing procedures for a second embodiment of the present invention shown in FIG. 6.

DETAILED DESCRIPTION OF THE PREFERRED EMBODIMENTS

Principle of the Present Invention

By means of a first embodiment of the present invention, when a plurality of cells is automatically arranged on a semiconductor substrate using a computer, the number of a lateral transit nets by which cut-lines are formed in the longitudinal direction is minimized by cell exchange in a long and narrow rectangular region which divides the chip in the longitudinal direction; and the size of a longitudinal transit [?] network by which cut-lines are formed in the lateral direction is minimized by cell exchange in a long and narrow rectangular region which divides the chip in the lateral direction. These processes are performed in parallel simultaneously, using a plurality of processors, each of which is responsible for a longitudinally divided region or a laterally divided region on the chip.

In addition, by means of a second embodiment of the present invention, a placement refinement process is implemented in parallel simultaneously by separate processors through group regionalization by parallel processing while restricting refinement errors to the minimum in each composite region within the grouped region. In each placement refinement process, cell placement is maximized over the entire chip surface, even when the placement process for the entire area of the chip is not handled at one time, by progressively modifying rectangular regions related to each group. Other features of this invention will become apparent in the course of the following description of exemplary embodiments which are given for illustration of the invention and are not intended to be limiting thereof.

The present invention will now be explained based on embodiments.

First Embodiment

Figure 3:
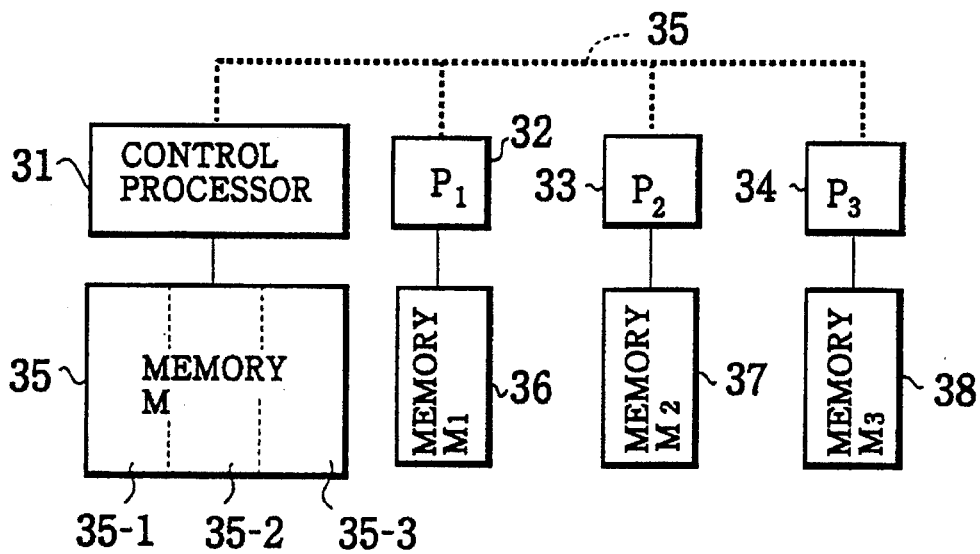
FIG. 3 is a schematic configuration diagram showing the relationship between various processors and memories in a first embodiment of the present invention.

FIG. 3 is a schematic configuration diagram showing the relationship between various processors respectively assigned to each divided region on a chip. Three rectangles 32 to 34 marked with a P indicate the respective processors allotted to each region of the chip.

Each of the processors 32 to 34 basically has a computing device and a memory device, and, as shown by the broken line, they are joined to a control side through a plurality of communication channels 35. The giving and receiving of placement data and total control is carried out via the communication channels 35. The processors 32 to 34 are operated in parallel.

Each processor 32 to 34 has a memory 36 to 38 for maintaining cell data for each region temporarily on a chip. For example, data for the wiring on a region on a chip processed by the processor 32 is stored in the memory 36.

When the processor 32 has finished processing, a control processor 31 introduces the data in the memory 36 into a memory region 35-1 in a memory 35. The volume of the memory 35 may be a volume which can store the cell data (data related to the wiring) for the entire chip.

In addition, the respective volumes of the memories 36 to 38 may be of a size which can store cell data corresponding to the respective regions into which the chip is divided.

Figure 4:
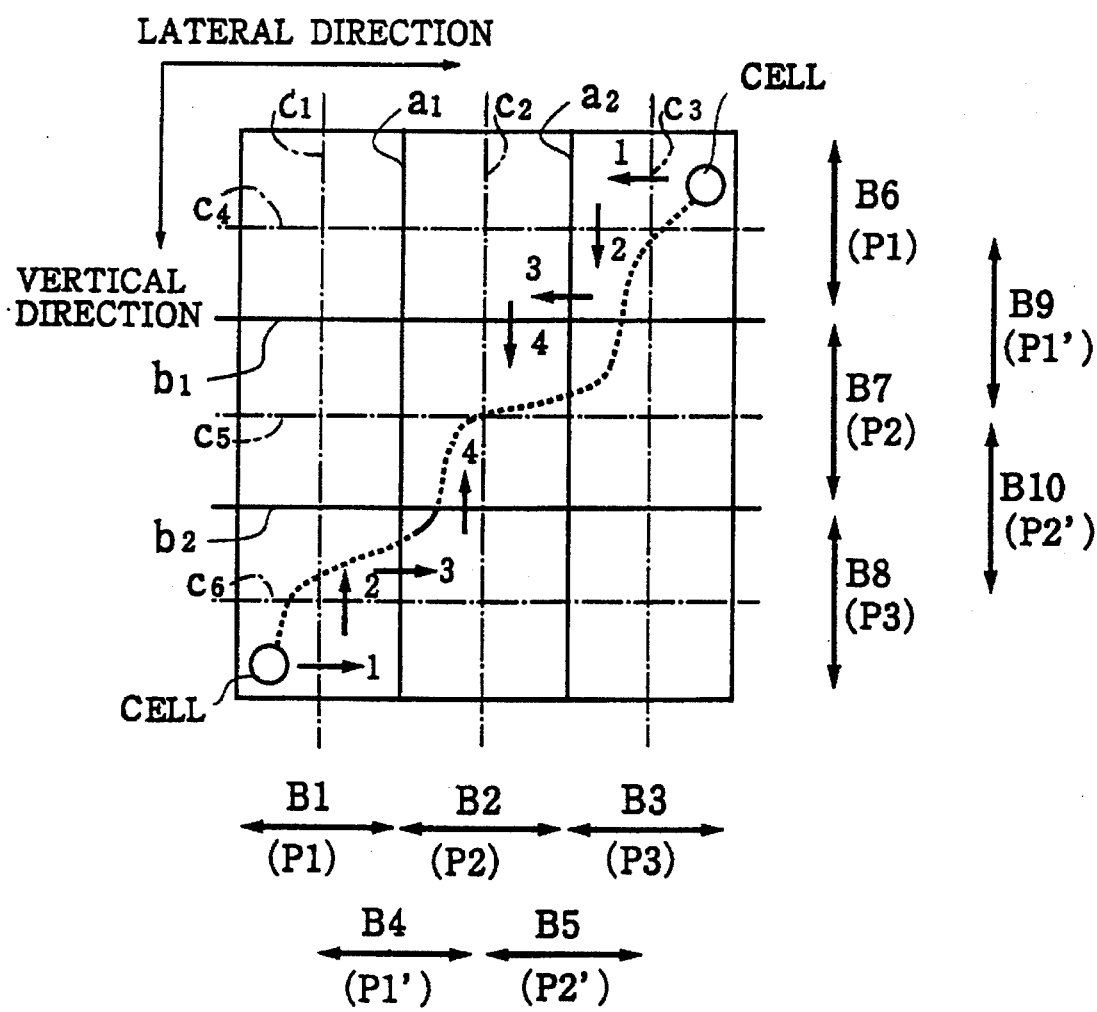
FIG. 4 is a diagram for explaining an outline of the process for the first embodiment of the present invention shown in FIG. 3.

FIG. 4 is a schematic diagram of a region on a chip for explaining a first embodiment of the present invention. A long, narrow rectangular region formed in the longitudinal direction partitioned off vertically on the chip, and a long, narrow rectangular region formed in the lateral direction partitioned off horizontally on the chip, are outlined by a pair of thick solid lines a1, a2 and a pair of thin solid lines b1, b2 respectively.

Also, long and short dash lines dividing these respective long, narrow rectangular regions into two parts indicate cut-lines passing through these regions.

A plurality of cells (one cell only is illustrated in FIG. 3) is positioned within each region contained by these cut-lines.

Figure 5:
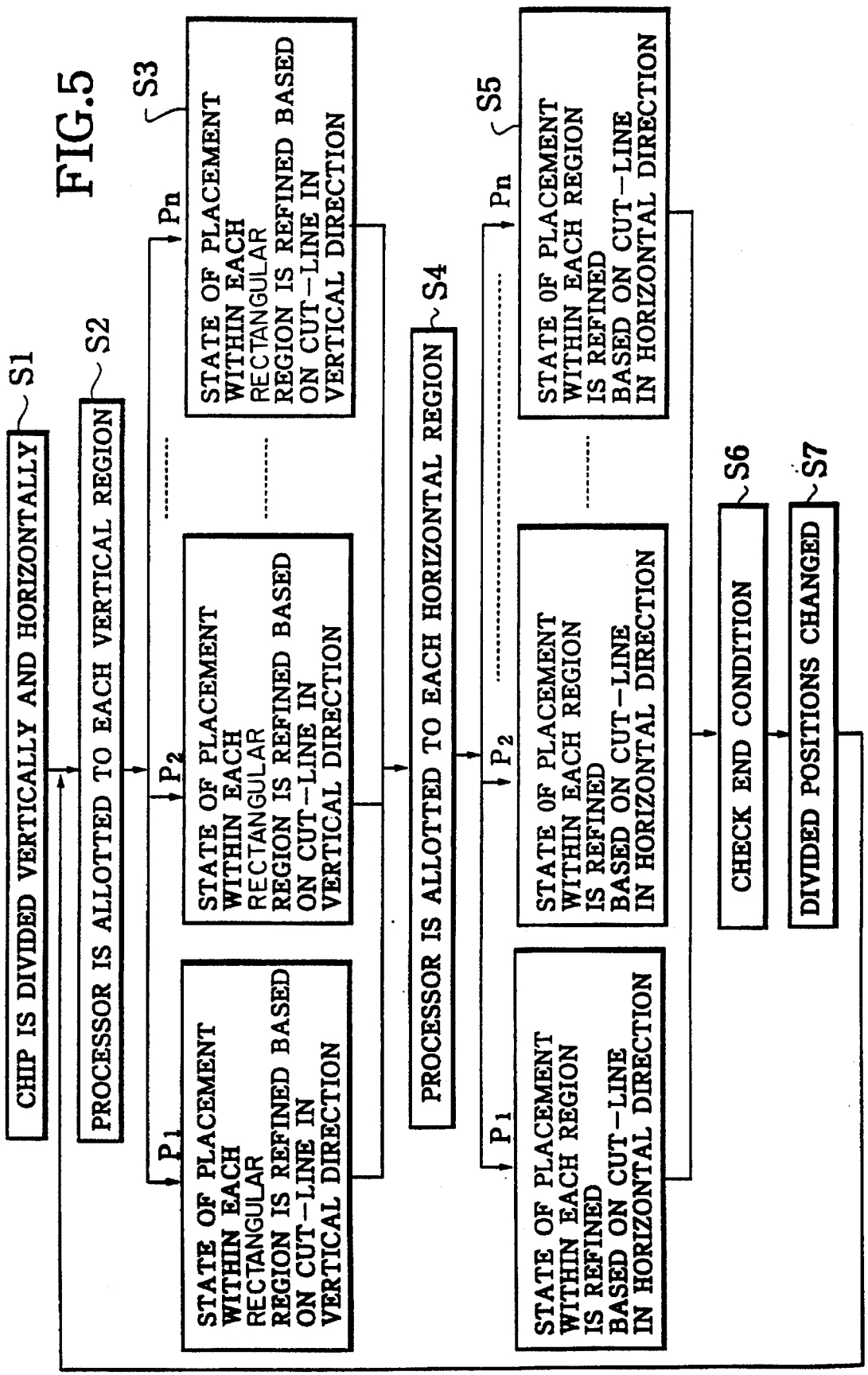
FIG. 5 is a flow chart showing the processing procedures for a first embodiment of the present invention shown in FIG. 3.

FIG. 5 is a flow chart for explaining the processing procedures for an automatic cell placement method for the first invention. This method will now be explained with reference to the flow chart.

First, a long, narrow rectangular region formed in the longitudinal direction cut off vertically in the chip region, and a long, narrow rectangular region formed in the lateral direction cut off horizontally in the chip region are divided off respectively, to form a plurality of longitudinal and lateral rectangular regions (Step S1). As a result, the chip is, for example, divided into three sections longitudinally and three sections laterally, as shown in FIG. 4.

Next, processors are allotted to the respective long, narrow rectangular regions obtained by the longitudinal division made in Step S1, and, the relationship among the processors 32 to 34 as shown in FIG. 3 is formed (Step S2). As a result, for example, in the case of FIG. 4, the three processors 32 to 34 as shown by the upper stage arrows p1, p2, and p3 in the lower section are allotted to the three longitudinally divided regions respectively.

Next, placement refinement in each region is repeated until the size of the network passed through is minimized for the cells in the respective longitudinal rectangular regions for which the processors 32 to 34 are responsible, based on the longitudinal cut-lines c1, c2, c3 passing through these sections. The results of the placement refinement in the memories 36 to 38 are stored in the memory 35 by the control processor 31. These processes are carried out in parallel in each processor simultaneously (Step S3). As a result, the placement refinement actions are performed in parallel by means of a cell exchange in the areas B1, B2, B3 as shown by the arrows in the lower section, upper stage of FIG. 4.

Further, in this case, the refinement progresses by moving the cells in parallel in the lateral direction only so that the number of the nets through which the lateral cut-lines c4, c5, c6 pass does not increase.

Next, processors are allotted (Step S4) to the respective long, narrow rectangular regions obtained by the lateral division made in Step S1. As a result, the three processors B6, B7, B8, as shown by the right section, left stage arrows p1, p2, and p3 in FIG. 4 are allotted to the three laterally-divided regions respectively. Next, placement refinement for each region is repeated until the size of the network passed through is minimized for the cells in the respective longitudinal rectangular regions (B6, B7, B8) of which the processors p1, p2, p3 are responsible, based on the lateral cut-lines c4, c5, c6 passing through these sections. These processes are carried out in parallel in each processor p1, p2, p3 simultaneously (Step S5).

The results of the placement refinement in the memories 36 to 38 are stored in the memory 35 by the control processor 31. As a result, the placement refinement actions are performed in parallel through a cell exchange in the areas B6, B7, B8 as shown by the arrows in the right section, left stage of FIG. 4, Further, in this case, the refinement progresses by moving the cells in parallel in the lateral direction only, so that the size of the network through which the longitudinal cut-lines c1, c2, c3 pass does not increase.

Finally, a decision is made (Step S6) as to whether the final conditions of the division level are satisfied. If the conditions are satisfied, the processing is complete. If not satisfied, the position of the divisions or the width of the divided region on the chip region is changed, and once again the chip is divided into longitudinally-divided regions and laterally-divided regions (Step S7), and the above-mentioned processes (Steps S2 to S6) are repeated.

As a result, for example, the action of placement refinement by means of a cell exchange in the areas B4, B5, and B9, B10, as shown by the lower section lower stage arrows and the right section right stage arrows in FIG. 4, is carried out in parallel as the next cycle by means of two processors p1' and p2' (not shown in the drawing).

By completing this type of procedure, for example, the placement of cells in the circles joined by a network of dotted lines shown in FIG. 4, is improved, following steps such as placing the arrows 1 to 4 in FIG. 4 close together.

Figure 1:
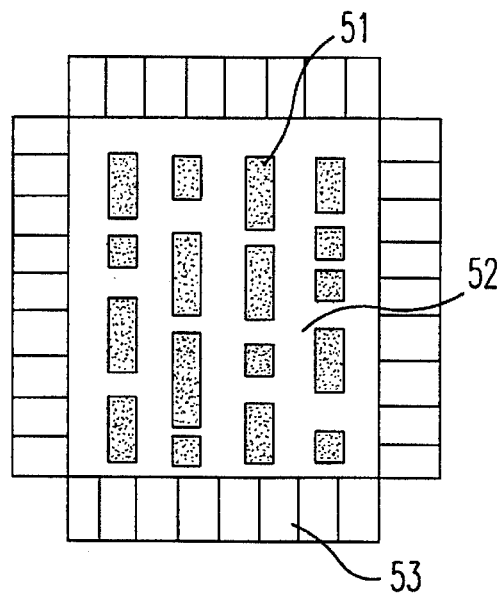
FIG. 1 is a view showing a schematic configuration of a placement pattern of a semiconductor integrated circuit chip designed using a normal gate array method.
Figure 2A:
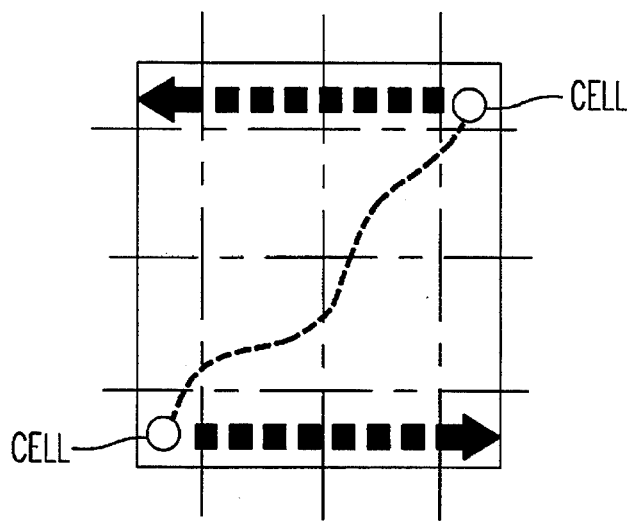
FIG. 2A and FIG. 2B are diagrams used in explaining a conventional placement refinement method performed in parallel.
Figure 2B:
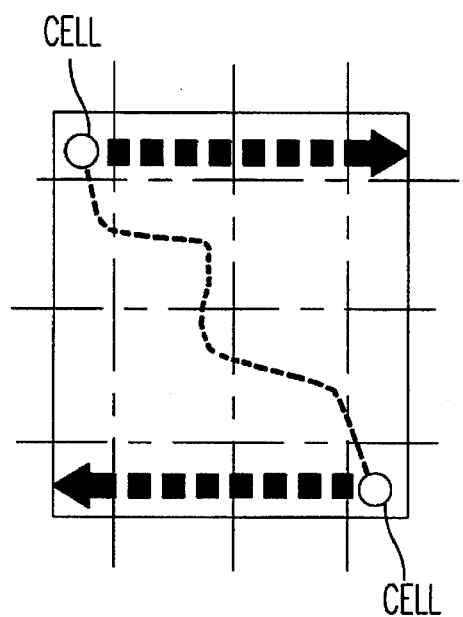

Accordingly, during placement refinement in parallel as explained by FIG. 2A, 2B the phenomenon of cell exchange oscillation does not occur, and refinement is completed at high speed.

Second Embodiment

Next, a second embodiment of the present invention will be explained.

Figure 6:
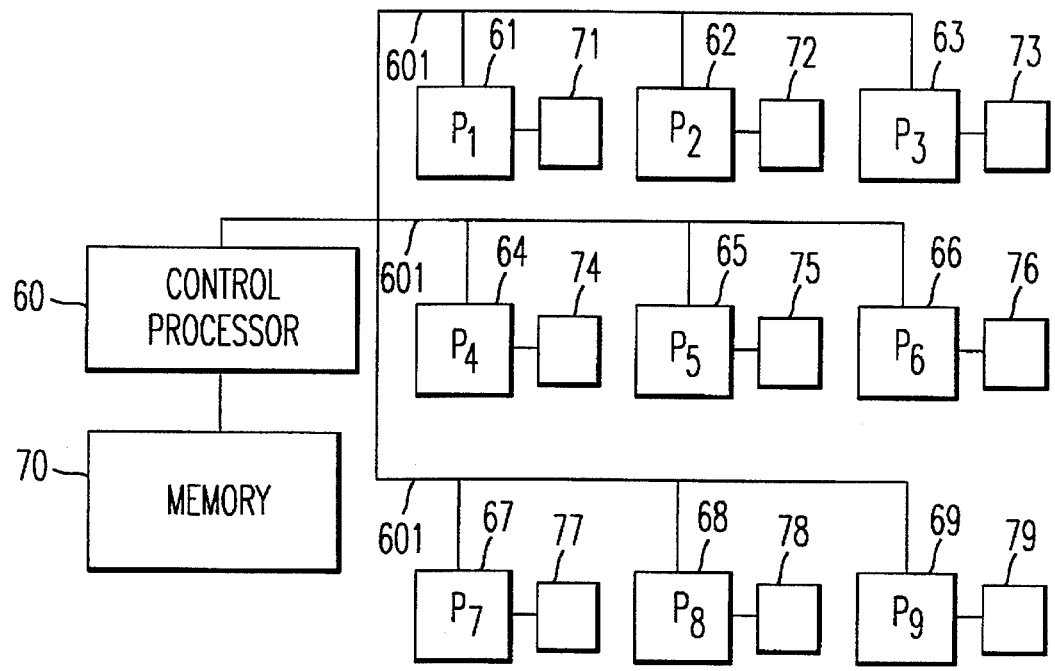
FIG. 6 is a schematic configuration diagram showing the relationship between various processors and memories in a second embodiment of the present invention.

FIG. 6 is a schematic configuration diagram showing the relationship between various processors respectively assigned to each region grouped on a chip.

Nine rectangles 61 to 69 marked with a P indicate the respective processors allotted to each composite region grouped on the chip.

Each of the processors basically has a computing device and a memory device in the same manner as covered in the first explanation, and, as shown by the heavy line, these devices are joined to a processor 60 on the control side through a plurality of communication channels 601. Specifically, each processor 61 to 69 has a memory 71 to 79 for temporarily storing cell data for each composite region on a chip. For example, data for the wiring on a composite region on a chip processed by the processor 61 is stored in the memory 71. When the processor 61 has finished processing, a control processor 60 introduces the data in the memory 71 into a memory region 70-1 in a memory 70. The volume of the memory 71 may be a volume which can store the cell data (data related to the wiring) of the entire chip.

In addition, the respective volumes of the memories 71 to 79 may be of a size which can store cell data corresponding to the respective regions into which the chip is divided. The giving and receiving of placement data and total control is carried out via the communication channels 601. The processors 61 to 69 are operated in parallel.

Figure 7:
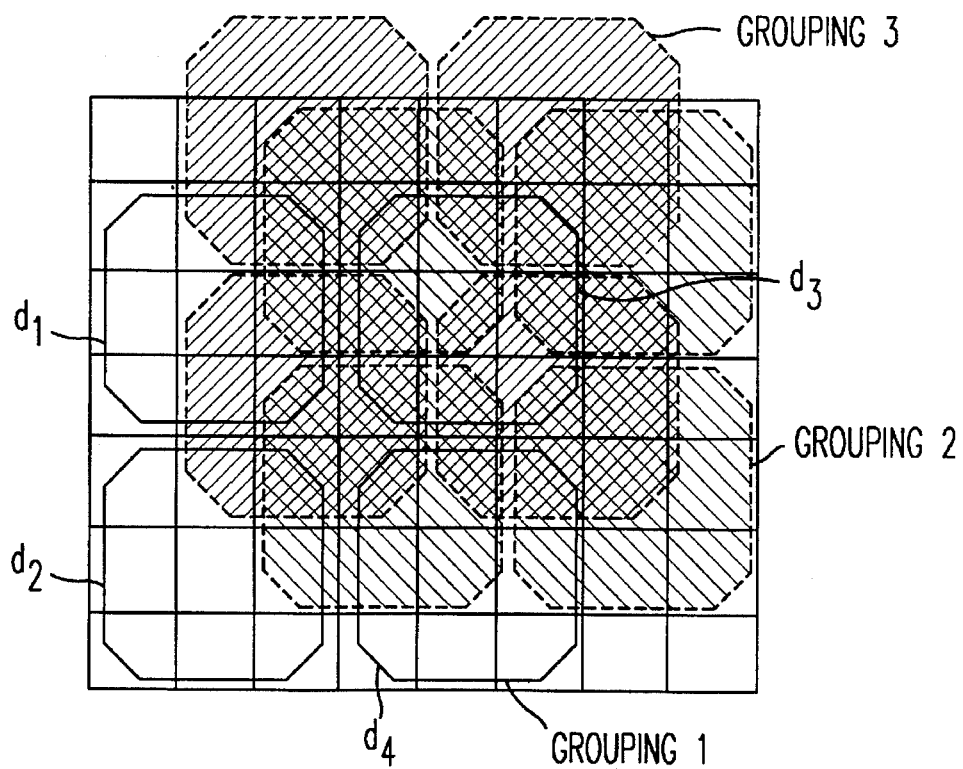
FIG. 7 is a diagram for explaining an outline of the process for the second embodiment of the present invention shown in FIG. 6.

FIG. 7 is a schematic diagram showing a grouping on a chip region for explaining a second embodiment. Four composite regions enclosed by heavy solid lines d1 to d4 are formed by grouping several rectangular regions prepared by being divided to form a lattice. Several regions of this composite type are grouped on the chip, and placement refinement processes proceed simultaneously in parallel in each of the respective grouped regions. After the refinement of placement is completed for this grouping, a different grouping is carried out by shifting one rectangular region, and this process is repeated. However, it is also possible to shift two or more rectangular regions. In the drawing, the grouping of four composite regions enclosed in one group by the thick solid lines d1 to d4 is illustrated (grouping 1), and the completed composite regions illustrated by slanted lines or shading are shown as different groupings (grouping 2, grouping 3).

If a latticed region is held in common between the groupings formed in this manner, it is possible for a cell to move around the total surface of the chip, thus providing global placement optimization.

FIG. 8 is a flow chart for explaining the processing procedures for an automatic cell placement method for the second invention.

This method will now be explained with reference to the flow chart. First, the chip region is divided into a plurality of rectangular regions to form a lattice (Step S81). In this manner the surface of the chip is divided into, for example, eight longitudinal regions and seven lateral regions as shown by the narrow lines in FIG. 7.

Next, several of the rectangular regions formed in Step S81 are arranged and grouped to form a plurality of composite regions on the chip (Step S82). The division into a partial region C4 enclosed by the thick line shown as the grouping 4 in FIG. 7 is an example of a grouping to form a composite region made up of nine rectangular regions in the form of a lattice. Next, in Step S83, separate processors are allotted to the various composite regions on the chip which have been grouped in Step S82. The relationship among the various processors is as shown in FIG. 6 to transfer the placement data to each other.

Next, placement refinement processes are implemented simultaneously in parallel in each composite region in the grouped regions, using the allotted processors (61 to 69) (Step S84). Here, the placement refinement is repeated for each processor only within the composite region for which that processor is responsible, therefore the placement can be improved in comparison with placement processing for the entire chip surface. After this placement refinement has been completed, the grouping of the rectangular regions carried out in Step S82 is renewed in each grouping (Step S85).

As a method of renewing the groupings, as illustrated with the grouping 2 or the grouping 3 of FIG. 7, the grouping is shifted while overlapping of the original grouping 1 is maintained. As a result, lattice-shaped rectangular regions which are related to a different group in the original grouping, become related to the same group in the next grouping. Accordingly, the cells move around on the total surface of the chip via part of the overlapping lattice region, and are placed in the optimum position.

In this manner, with the second embodiment it is possible to optimize the placement over the entire surface of the chip even when the placement refinement for each divided region is unrelated.

Finally, a decision is made as to whether the degree of placement refinement is final, and as to whether the final conditions are satisfied (Step S86). If the conditions are satisfied, the processing is complete. If not satisfied, the above-mentioned processes from Steps S83 to S85 are repeated. Placement refinement over the entire surface of the chip progresses at high speed, as outlined above.

The present invention is not limited to the above-mentioned second embodiment, but various changes can be implemented within the scope of the invention without departing from the intent of the invention.

For example, the size of the grouped regions can be varied from large to small according to the progress of the placement refinement, and the shape of the group need not be rectangular but can be varied according to the strategy of the placement refinement.

In addition, in the case where the number of processors which can be used is comparatively small, one processor can correspond to a plurality of divided regions.

Also, as a method of grouping, it is not necessary that the total chip surface be covered as in the embodiments described. It is also possible to implement the second invention after scanning the chip region several times.

As outlined above, by means of the first embodiment of the present invention, it is possible to carry out processing simultaneously in parallel, using a plurality of processors, minimizing the number of lateral nets and longitudinal nets passed through.

In addition, excessive time is not required because the independent cell pairs are limited, and errors in the degree of refinement evaluated in parallel are not produced.

As a result, limitation of cell selection during placement refinement in parallel is unnecessary, and the placement refinement process is performed at high speed.

Also, by means of the second embodiment of the present invention, placement refinement can be provided over the entire chip surface without using the placement process for the total chip surface more than once.

What is claimed is:

1. A method for automatically optimizing cell placement of a plurality of logic cells arranged on a semiconductor chip using a plurality of processors and a second processor, each processor having a memory, and the second processor having a second memory, the method comprising:

(1) initially positioning the plurality of logic cells on the semiconductor chip;

(2) dividing the semiconductor chip into a plurality of first rectangular regions along a first direction, and allocating each processor of the plurality of processors to each first rectangular region;

(3) sub-dividing said first rectangular regions by a predetermined number of cut lines, parallel to the first direction;

(4) moving the plurality of logic cells across the cut lines in a direction perpendicular to the cut lines in each first rectangular region;

(5) calculating an evaluation function at every movement of the plurality of logic cells in each first rectangular region using each processor, for moving the plurality of logic cells across the cut lines in a perpendicular direction to the first direction until a final condition that a placement pattern is acquired of which a evaluated value is not changed or is not decreased against those of every other placement patterns for each first rectangular region, and then storing the placement pattern of the plurality of logic cells in each first rectangular region and the evaluated value into the memory in each processor;

(6) dividing, after step (5), the semiconductor chip into a plurality of second rectangular regions along a second direction, different from the first direction, and each processor of the plurality of processors being provided for each second rectangular region;

(7) sub-dividing said second rectangular regions by a predetermined number of cut lines, parallel to the second direction;

(8) moving the plurality of logic cells across the cut lines in a direction perpendicular to the cut lines in each second rectangular region;

(9) calculating an evaluation function at every movement of the plurality of logic cells in each second rectangular region using each processor, for moving the plurality of logic cells across the cut lines in a perpendicular direction to the second direction until a final condition that a placement pattern is acquired of which a evaluated value is not changed or is not decreased against those of every other placement patterns for each second rectangular region, and then for storing the placement pattern of the plurality of logic cells in each second rectangular region and the evaluated value into the memory in each processor;

(10) storing the placement patterns, which have been stored in the memory in each processor, into the second memory using the second processor when the final condition for the evaluated value for each first and second rectangular regions is satisfied;

wherein, the first rectangular regions do not overlap each other, and the second rectangular regions do not overlap each other;

wherein, the steps (6) to (9) are executed after the steps (1) to (5);

wherein, the plurality of processors for the first rectangular regions operate in parallel in the steps (3), (4), and (5); and wherein, the plurality of processors for the second rectangular regions operate in parallel in the steps (7), (8), and (9).

2. A method for automatically optimizing cell placement of a plurality of logic cells as claimed in claim 1, wherein, in the step (2), a width of each of the first rectangular regions, the number of the first rectangular regions, a position of each of the first rectangular regions are changed, and then the steps (3), (4), and (5) are executed; and wherein, in the step (6), a width of each of the second rectangular regions, the number of the second rectangular regions, a position of each of the second rectangular regions are changed, and then the steps (7), (8), and (9) are executed.

3. A method for automatically optimizing cell placement of a plurality of logic cells as claimed in claim 1, wherein when the number of the plurality of processors is less than the number of first rectangular regions, at first, the evaluated values for the first rectangular regions whose number is equivalent to the number of the plurality of processors are calculated in parallel, and when the evaluated value for the first rectangular region is reached to the final condition, the processor for the first rectangular region whose evaluated value is reached to the final condition is used for a remainder of first rectangular regions whose evaluated value are not calculated, and the same manner is performed for the second rectangular regions when the number of the plurality of processors is less than the number of second rectangular regions.

4. A method for automatically optimizing cell placement of a plurality of logic cells as claimed in claim 1, wherein the number of the cut lines is one in each first rectangular region and in each second rectangular region.

5. A method for automatically optimizing cell placement of a plurality of logic cells arranged on a semiconductor chip, the method comprising:

(1) initially positioning the plurality of logic cells on the semiconductor chip;

(2) dividing the semiconductor chip into a plurality of imaginary first rectangular regions along a first direction;

(3) sub-dividing said first rectangular regions by a predetermined number of imaginary cut lines, parallel to the first direction;

(4) allocating a processor to each of the first rectangular regions;

(5) evaluating, using parallel processing of the processors, each said first rectangular region to determine which of said logic cells should be moved in a direction perpendicular to the first direction to lessen the number of wires connecting said logic cells and storing a placement pattern of the logic cells in each first rectangular region;

wherein each said logic cell can be moved across a single cut-line during each iteration of step (5);

(6) dividing, after step (5), the semiconductor chip into a plurality of imaginary second rectangular regions along a second direction, different from the first direction;

(7) sub-dividing said second rectangular regions by a predetermined number of imaginary cut lines, parallel to the second direction;

(8) allocating a processor to each of the second rectangular regions;

(9) evaluating, using parallel processing of the processors, each said second rectangular region to determine which of said logic cells should be moved in a direction perpendicular to the second direction to lessen the number of wires connecting said logic cells and storing a placement pattern of the logic cells in each second rectangular region;

wherein, each said logic cell can be moved across a single cut-line during each iteration of step (9); and

(10) storing the placement patterns which have been stored in a memory in each processor and reiterating steps (4)–(9), using placement patterns which have been sorted, until it is determined that no more logic cells need be moved to lessen the number of wiring connections.

* * * * *